US011569679B2

(12) United States Patent
Ting et al.

(10) Patent No.: US 11,569,679 B2
(45) Date of Patent: Jan. 31, 2023

(54) INTELLIGENT ENERGY HARVESTING DEVICE, VOLTAGE SIGNAL APPLICATION SYSTEM AND ENERGY MANAGEMENT MODULE THEREOF

(71) Applicant: CHUNG-YUAN CHRISTIAN UNIVERSITY, Chung Li (TW)

(72) Inventors: Yung Ting, Chung Li (TW); Sheuan-Perng Lin, Chung Li (TW); Chih-Hsuan Yu, Chung Li (TW); Yuan-Yu Chou, Chung Li (TW)

(73) Assignee: CHUNG-YUAN CHRISTIAN UNIVERSITY, Tao Yuan County (TW)

( * ) Notice: Subject to any disclaimer, the term of this patent is extended or adjusted under 35 U.S.C. 154(b) by 763 days.

(21) Appl. No.: 16/574,715

(22) Filed: Sep. 18, 2019

(65) Prior Publication Data

US 2020/0091759 A1 Mar. 19, 2020

(30) Foreign Application Priority Data

Sep. 19, 2018 (TW) ................................ 107132977

(51) Int. Cl.

*H02N 2/18* (2006.01)
*H02J 7/32* (2006.01)
*G06K 19/07* (2006.01)

(52) U.S. Cl.

CPC ............ *H02J 7/32* (2013.01); *G06K 19/0723* (2013.01); *H02N 2/18* (2013.01)

(58) Field of Classification Search

None

See application file for complete search history.

(56) References Cited

U.S. PATENT DOCUMENTS

| | | | | |
|---|---|---|---|---|
| 5,309,096 | A * | 5/1994 | Hoegnelid | G01R 33/0283 324/226 |
| 2014/0195103 | A1* | 7/2014 | Nassef | G01L 5/225 701/31.5 |
| 2017/0324022 | A1* | 11/2017 | Ting | H01L 41/053 |

FOREIGN PATENT DOCUMENTS

| | | | |
|---|---|---|---|
| CN | 2069932 | U | 1/1991 |
| CN | 207967957 | U | 10/2018 |
| TW | 201008825 | A | 3/2010 |
| TW | M508501 | U | 9/2015 |

* cited by examiner

*Primary Examiner* — John F Mortell

(74) *Attorney, Agent, or Firm* — Muncy, Geissler, Olds & Lowe, P.C.

(57) ABSTRACT

An intelligent energy harvesting device, a voltage signal application system, and an energy management module thereof are disclosed. The intelligent energy harvesting device is used to transfer a signal to an application device. The intelligent energy harvesting device includes a power generation module, a battery and an energy management module. The power generation module generates a first voltage signal. The battery generates a second voltage signal. The energy management module is electrically connected to the power generation module and the battery for enabling the first voltage signal output from the power generation module to be used as a power signal to provide the application device, or enabling the first voltage signal output from the power generation module and the second voltage signal output from the battery collectively serves as the power signal to provide the application device.

16 Claims, 8 Drawing Sheets

INTELLIGENT ENERGY HARVESTING DEVICE, VOLTAGE SIGNAL APPLICATION SYSTEM AND ENERGY MANAGEMENT MODULE THEREOF

BACKGROUND OF THE INVENTION

1. Field of the Invention

The present invention relates to an intelligent energy harvesting device, a voltage signal application system, and an energy management module thereof, particularly to an intelligent energy harvesting device capable of managing energy effectively, a voltage signal application system and an energy management module thereof.

2. Description of the Related Art

With the progress of the times, the battery has become an indispensable component, and the battery life has become an important consideration for users. To increase the use time of electronic devices, a variety of energy harvesting devices that utilize environmentally independent power generation have been developed. The simple definition of energy harvesting devices is to collect the energy of the surrounding environment and convert it into electrical energy for use by connected devices. Energy harvesting device can collect the source of environmental energy, mainly for light energy, vibration energy, thermal energy and radio wave and inductance energy. However, the current energy harvesting device is large in size, leading to more restrictions on the application. The power generated by the energy harvesting device can only be directly supplied to the electronic device. Furthermore, the energy harvesting devices in the prior art do not have the technology to effectively manage energy.

Accordingly, it is necessary to devise a new intelligent energy harvesting device, a voltage signal application system and an energy management module thereof to solve the problem in the prior art.

SUMMARY OF THE INVENTION

It is a major objective of the present invention to provide an intelligent energy harvesting device having the effect of effectively managing energy.

It is another major objective of the present invention to provide an energy management module used for the aforementioned intelligent energy harvesting device.

It is a further major objective of the present invention to provide a voltage signal application system having the aforementioned intelligent energy harvesting device.

To achieve the above objectives, the intelligent energy harvesting device in the present invention is used to transfer a signal to an application device. The intelligent energy harvesting device includes a power generation module, a battery and an energy management module. The power generation module is used to generate a first voltage signal. The battery is used to generate a second voltage signal. The energy management module is electrically connected to the power generation module and the battery, for enabling the first voltage signal output from the power generation module to be used as a power signal to provide to the application device, or enabling the first voltage signal output from the power generation module and the second voltage signal output from the battery to collectively serve as the power signal to provide to the application device.

The energy management module in the present invention is used in the intelligent energy harvesting device, and is electrically connected to the power generation module and the battery to transfer a signal to an application device. Specifically, the power generation module is used to generate a first voltage signal, and the battery is used to generate a second voltage signal. The energy management module includes a first diode, a second diode, a third diode, a first switch, a second switch, a third switch, a fourth switch and a fifth switch. The first diode is electrically connected between the power generation module and the battery. The second diode is electrically connected to the power generation module. The third diode is connected to the power generation module and a ground. A first base, a first collector, and a first emitter of the first switch are electrically connected to the second diode, the battery and a ground, respectively. A second base and a second collector of the second switch are electrically connected to the power generation module, and a second emitter is electrically connected to the application device. A third base, a third collector and a third emitter of the third switch are electrically connected to the battery, the power generation module and the ground, respectively; specifically, the second base, the second collector, a third collector, and the second diode are connected to a first common point. A fourth base and a fourth emitter of a fourth switch are electrically connected to the battery and the ground, respectively; specifically, the first collector, the third base, and the fourth base are connected to a second common point. A fifth base, a fifth collector and a fifth emitter of a fifth switch are electrically connected to the fourth collector, the application device and the battery of the fourth switch, respectively; thereby enabling the first voltage signal output from the power generation module to be used as a power signal to provide to the application device, or enabling the first voltage signal output from the power generation module and the second voltage signal output from the battery to collectively serve as the power signal to provide to the application device.

A voltage signal application system in the present invention includes an application device and an intelligent energy harvesting device. The intelligent energy harvesting device is used to supply a power signal to the application device. The intelligent energy harvesting device includes a power generation module, a battery and an energy management module. The power generation module is used to generate a first voltage signal. The battery is used to generate a second voltage signal. The energy management module is electrically connected to the power generation module and the battery, for enabling the first voltage signal output from the power generation module to be used as a power signal to provide to the application device, or enabling the first voltage signal output from the power generation module and the second voltage signal output from the battery to collectively serve as the power signal to provide to the application device.

DETAILED DESCRIPTION OF THE PREFERRED EMBODIMENT

Hereafter, the technical content of the present invention will be better understood with reference to preferred embodiments.

Figure 1:
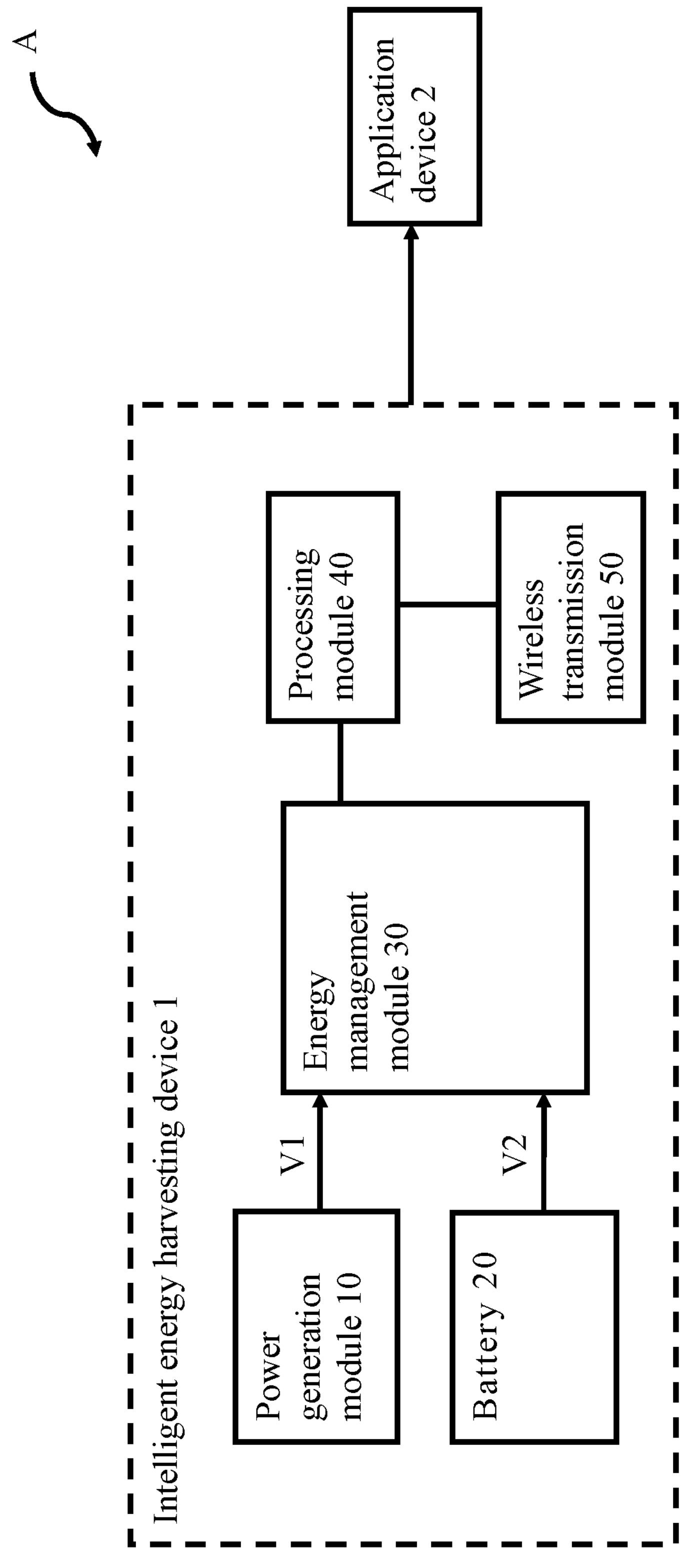
FIG. 1 is an architecture diagram of an intelligent energy harvesting device in the present invention.

Hereafter please first refer to FIG. 1 for an architecture diagram of an intelligent energy harvesting device in the present invention.

An intelligent energy harvesting device 1 in the present invention is used in a voltage signal application system A, for generating a signal to transfer to an application device 2, or generating a power signal to provide to the application device 2. The intelligent energy harvesting device 1 includes a power generation module 10, a battery 20 and an energy management module 30. The power generation module 10 is used to generate a first voltage signal V1. The battery 20 is used to generate a second voltage signal V2. The energy management module 30 is electrically connected to the power generation module 10 and the battery 20, for enabling the first voltage signal V1 output from the power generation module 10 to be used as a power signal to provide to the application device 2, or enabling the first voltage signal V1 output from the power generation module 10 and the second voltage signal V2 the battery 20 to collectively serve as the power signal to provide to the application device 2. In addition, when the first voltage signal output from the energy management module 30 is large, the energy management module 30 further enables the power generation module 10 to charge the battery 20. The circuit architecture for achieving the efficiency of the energy management module 30 will be described in detail later, and will not be described here.

Figure 2:
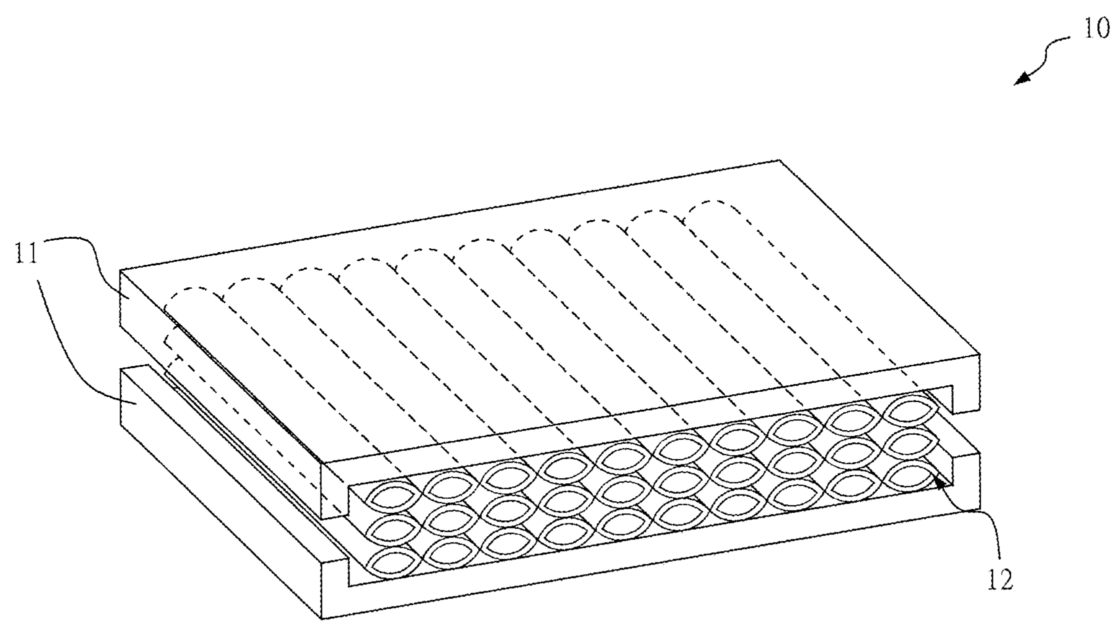
FIG. 2 is a schematic perspective view of a power generation module of the intelligent energy harvesting device.

Then, please refer to FIG. 2 for a schematic perspective view of a power generation module of an intelligent energy harvesting device.

In an embodiment of the present invention, the power generation module 10 generates electricity by piezoelectric induction. Thus, the power generation module 10 includes a shell 11, a plurality of curved metal structures 12 and a plurality of curved piezoelectric elements (not shown). The plurality of curved metal structures 12 are disposed in the shell 11, and the plurality of curved piezoelectric elements are attached to the plurality of curved metal structures 12. When the shell 11 is compressed, the plurality of curved metal structures 12 are deformed at the same time, and the pair of curved piezoelectric elements attached thereto are also deformed. Consequently, the first voltage signal V1 is generated due to a piezoelectric direct effect.

In an embodiment of the present invention, the power generation module 10 can be sized to fit on a casual sneaker or a bicycle pedal and generate approximately 10 mW of power over a period of time when operating at around 1 Hz, but the present invention is not limited thereto. Accordingly, the power generation module 10 can be applied to wireless Bluetooth communication, identity authentication, pedometer, LED light display, emergency support signal, etc., and used with a regional signal receiver provided by a manufacturer for positioning tracking, but the present invention is not limited thereto.

Figure 3:
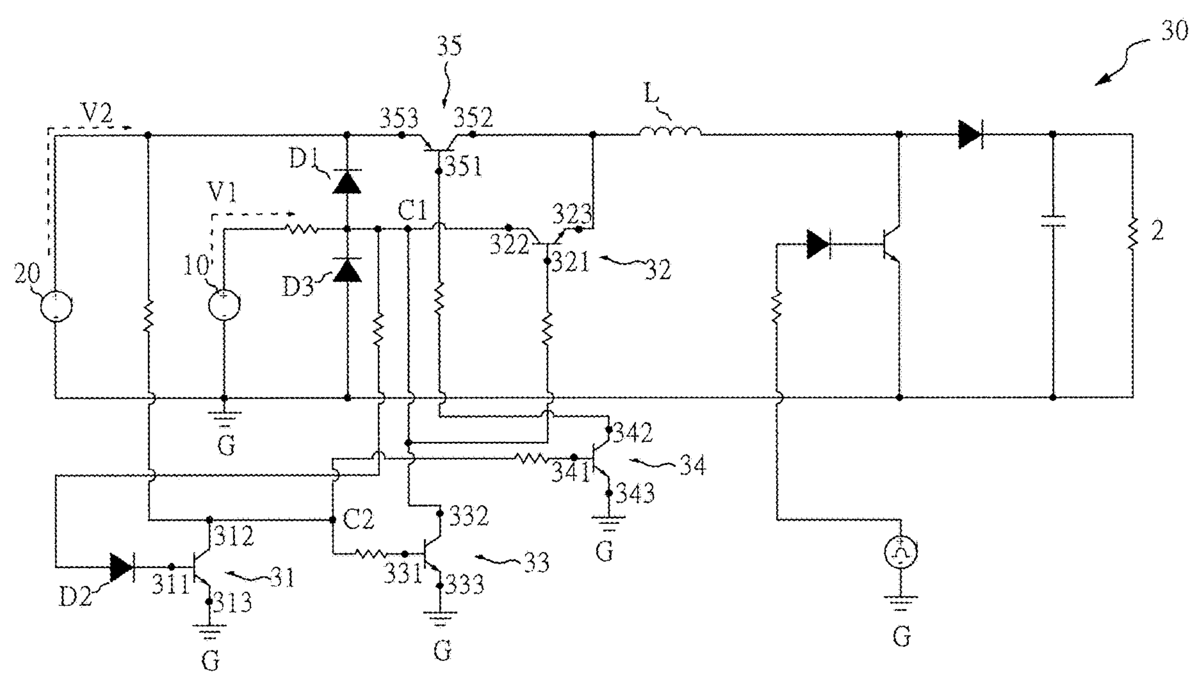
FIG. 3 is a circuit diagram of an energy management module of the intelligent energy harvesting device in the present invention.

Then, please refer to FIG. 3 for a circuit diagram of an energy management module of the intelligent energy harvesting device in the present invention.

In an embodiment of the present invention, the energy management module 30 includes circuit components such as a first diode D1, a second diode D2, a third diode D3, a first switch 31, a second switch 32, a third switch 33, a fourth switch 34, and a fifth switch 35, but the present invention is not limited to the circuit components listed here. The first switch 31, the second switch 32, the third switch 33, the fourth switch 34 and the fifth switch 35 may be a bipolar transistor. The first diode D1 is electrically connected between the power generation module 10 and the battery 20, and the third diode D3 is connected to the power generation module 10 and a ground G. The second diode D2 is electrically connected to the power generation module 10.

The first switch 31 includes a first base 311, a first collector 312 and a first emitter 313 electrically connected to the second diode D2, the battery 20 and the ground G, respectively. The second switch 32 includes a second base 321, a second collector 322 and a second emitter 323, second base 321. The second collector 322 is electrically connected to the power generation module 10, and the second emitter 323 is electrically connected to the application device 2. The third switch 33 includes a third base 331, a third collector 332, and a third emitter 333. The third base 331, the third collector 332, and the third emitter 333 are electrically connected to the battery 20, the power generation module 10, and the ground G, respectively. Specifically, the second base 321, the second collector 322, the third collector 332, and the second diode D2 are connected to a first common point C1. The fourth switch 34 includes a fourth base 341, a fourth collector 342, and a fourth emitter 343. The fourth base 341 and the fourth emitter 343 are electrically connected to the battery 20 and the ground G, respectively. Specifically, the first collector 312, the third base 331 and the fourth base 341 are connected to a second common point C2. The fifth switch 35 includes a fifth base 351, a fifth collector 352, and a fifth emitter 353. The fifth base 351, the fifth collector 352, and the fifth emitter 353 are electrically connected to a fourth collector 342 of the fourth switch 34, the application device 2, and the battery 20, respectively. The energy management module 30 further includes a boost circuit L for fixedly outputting 5V power signals to the application device 2. The energy management module 30 also includes other circuit components. Since other circuit components are not the focus of energy management, they are not described in detail herein.

Figure 4A:
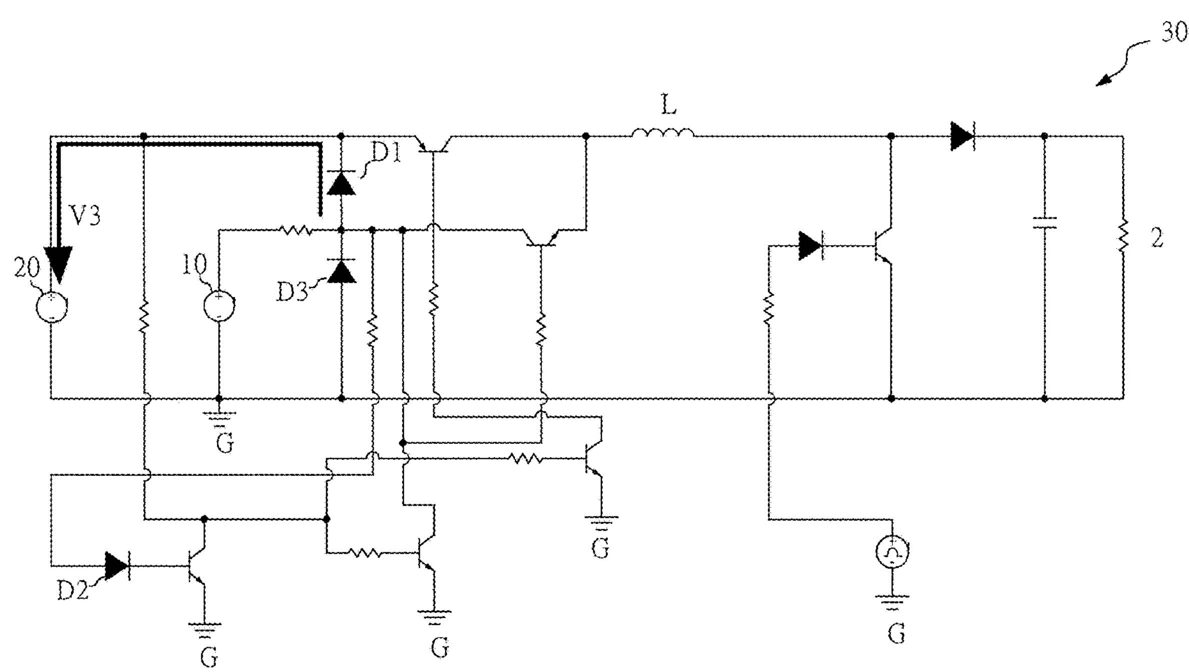
FIG. 4A is a schematic diagram showing the current of the energy management module of the intelligent energy harvesting device used in a first use mode in the present invention.

Then, please refer to FIG. 4A for a schematic diagram showing the current of the energy management module of the intelligent energy harvesting device used in a first use mode in the present invention.

In the first use mode of the present invention, when the first voltage signal V1 output from the power generation module 10 is greater than a first specific value, for example, greater than 4V or 3.7V, The first voltage signal V1 transmits a third voltage signal V3 exceeding the first specific value to the battery 20 via the first diode D1, that is, charging the battery 20 with a voltage portion exceeding 4V or 3.7V. In addition, since the third diode D3 is connected to the ground G, if the second voltage signal V2 is smaller than the ground signal (a point of zero), that is, the negative voltage value, the third diode D3 is turned on, and the negative voltage is introduced into the ground G.

Figure 4B:
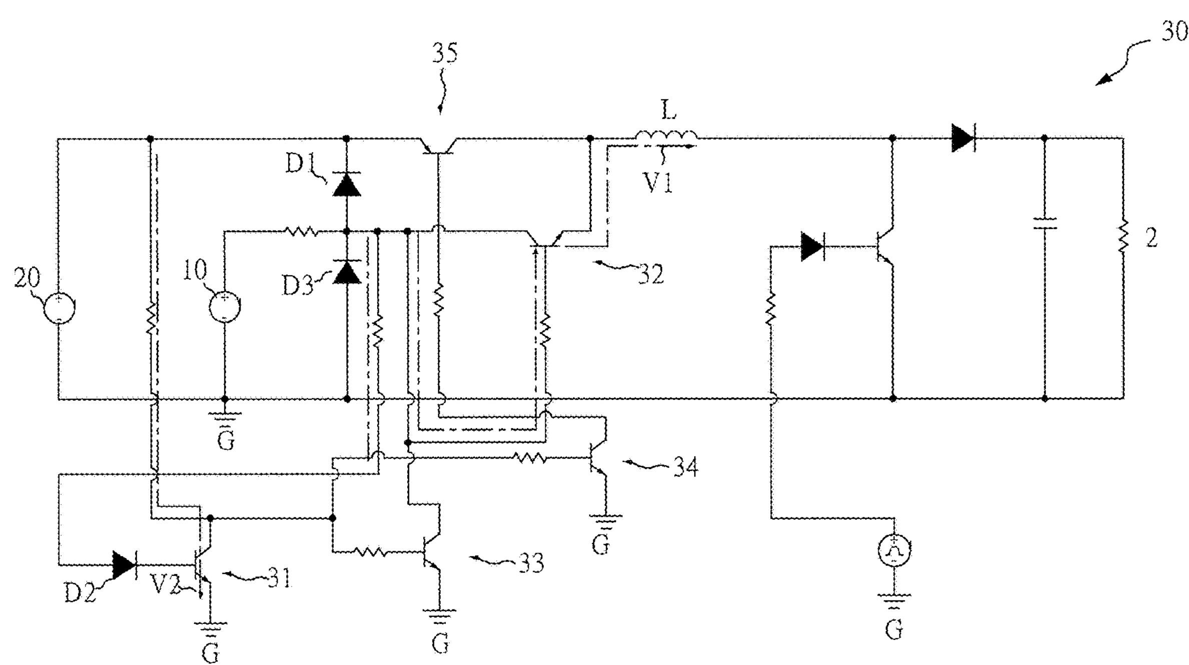
FIG. 4B is a schematic diagram showing the current of the energy management module of the intelligent energy harvesting device used in a second use mode in the present invention.

Then, please refer to FIG. 4B for a schematic diagram showing the current of the energy management module of the intelligent energy harvesting device used in a second use mode in the present invention.

When the first voltage signal V1 output from the power generation module 10 is greater than a second specific value, for example, 1V, the first voltage signal V1 controls the first switch 31 via the second diode D2, such that the second voltage signal V2 of the battery 20 is directly transmitted to the ground G. Then the second switch 32 is turned on, and the power generation module 10 outputs the first voltage signal V1 to the boost circuit L via the second switch 32 to improve the accuracy up to 5V to transfer to the application device 2. Accordingly, the power generation module 10 can supply power to the application device 2 directly.

Figure 4C:
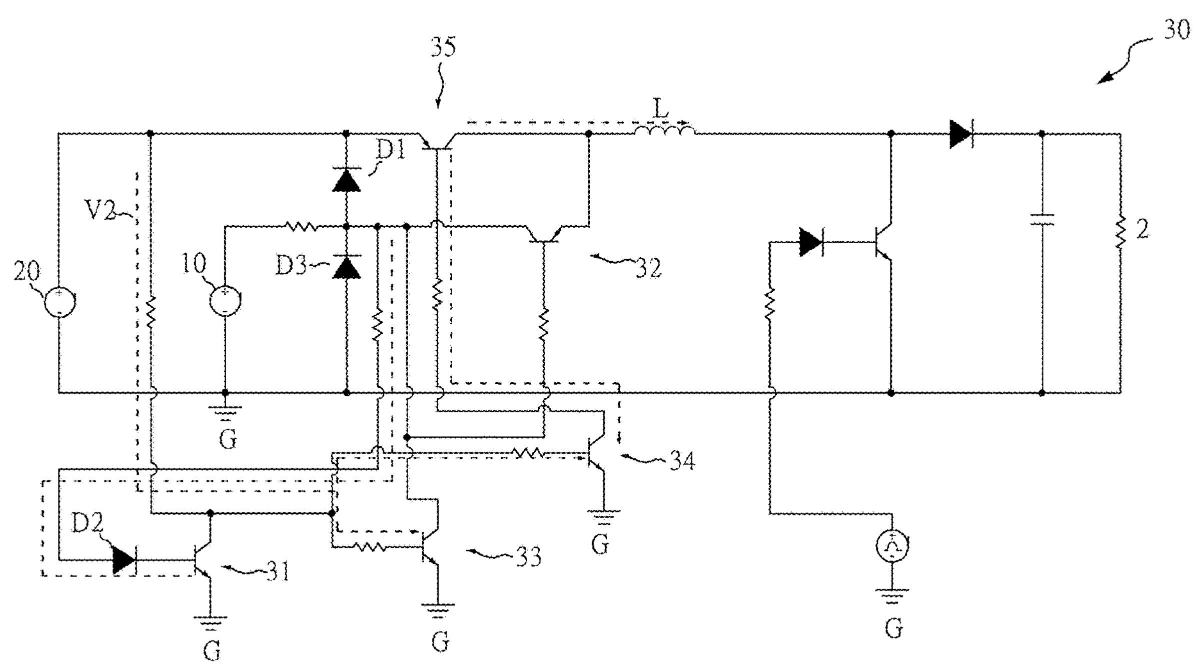
FIG. 4C is a schematic diagram showing the current of the energy management module of the intelligent energy harvesting device used in a third use mode in the present invention.

Finally, please refer to FIG. 4C for a schematic diagram showing the current of the energy management module of the intelligent energy harvesting device used in a third use mode in the present invention.

When the first voltage signal V1 output from the power generation module 10 is lower than the second specific value, the first voltage signal V1 is insufficient to directly supply the boost circuit L at the back end. Thus, the second voltage signal V2 output from the battery 20 needs to be added thereto. Moreover, since the first voltage signal V1 is insufficient to control the first switch 31 to be turned on, the second voltage signal is not transmitted to the ground G. Therefore, the second voltage signal V2 output from the battery 20 controls the third switch 33 and the fourth switch 34 to be turned on, so that the fifth switch 35 is turned on. Consequently, the power generation module 10 outputs the first voltage signal V1 via the second switch 32 and the battery 20 outputs the second voltage signal V2 via the fifth switch 35 to pass through the boost circuit L together to raise the level to 5V for transmission to the application device 2.

As can be seen from the above, when the first voltage signal V1 output from the power generation module 10 is lower than the second specific value, the energy management module 30 can perform a battery-assisted power supply composite mode (as FIG. 4C). When the first voltage signal V1 output from the power generation module 10 is greater than the second specific value but less than the first specific value, the energy management module 30 can perform a direct supply mode (as FIG. 4B). When the first voltage signal V1 output from the power generation module 10 is greater than the first specific value, the first voltage signal V1 can be supplied to the application device 2, and the energy management module 30 can also perform a charging mode (as FIG. 4A). In the present invention, the intelligent generation device 1 can use the power generation module 10 of a piezoelectric element to achieve the small size, and is equipped with a battery 20 and an energy management module 30 to achieve a direct supply mode, allowing for autonomous switch between three modes including the direct supply mode, the charging mode and the battery-assisted power supply composite mode.

Figure 5A:
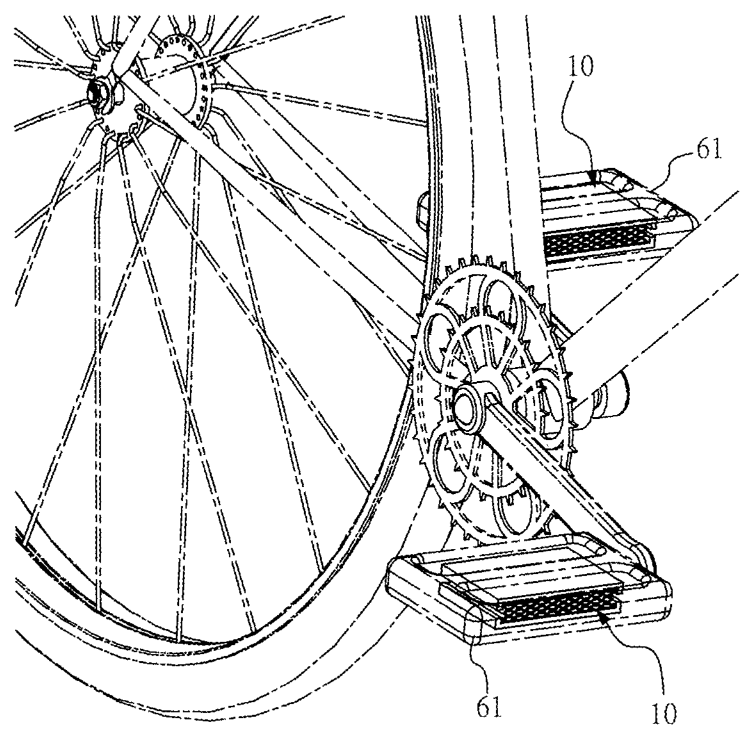
FIG. 5A is a schematic diagram of a voltage signal application system according to a first embodiment of the present invention.
Figure 5B:
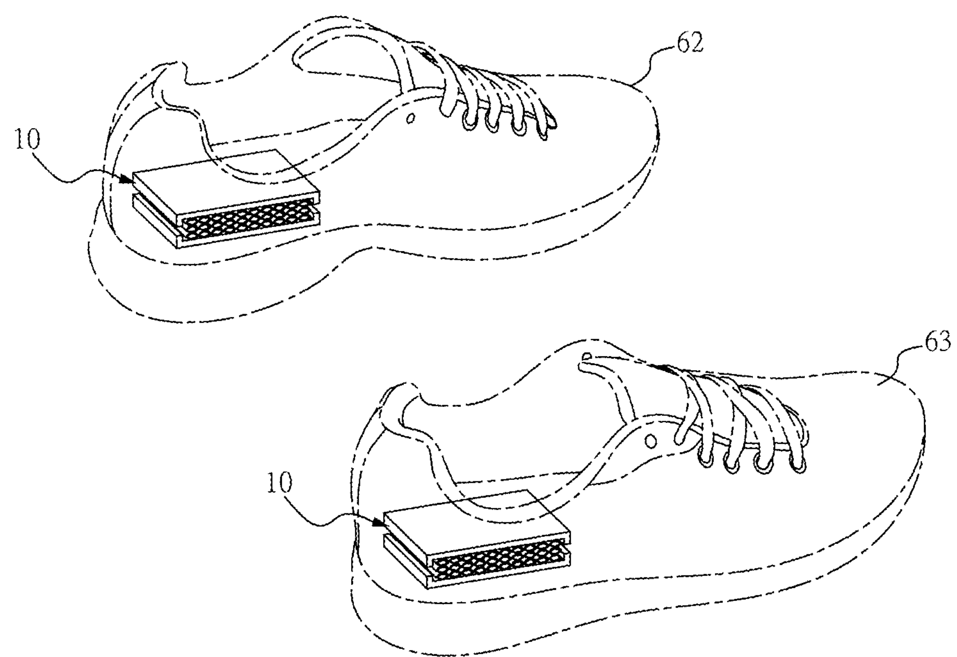
FIG. 5B is a schematic diagram of a voltage signal application system to according to a second embodiment of the present invention.

Accordingly, in a voltage signal application system A of the present invention, an intelligent energy harvesting device 1 can be used for a variety of application devices 2. Please refer to FIG. 5A for a schematic diagram of the voltage signal application system according to a first embodiment of the present invention, and FIG. 5B for a schematic diagram of the voltage signal application system according to a second embodiment of the present invention.

For example, in the first or second embodiment of the present invention, the power generation module 1 is disposed in a bicycle pedal 61 or shoes 62, 63. By pressing the power generation module 10, power can be generated to provide to the application device. For example, the generated power signal can be used for wireless communication to transmit control command signals or data to the mobile phone, pedometer, etc., and can also be used to illuminate the LED light and show different modes for entertainment or special purposes.

Moreover, the intelligent energy harvesting device 10 can further include a processing module 40 and a wireless transmission module 50. The processing module 40 is used to calculate a frequency at which a first voltage signal is generated. The wireless transmission module 50 is used to connect to the application device 2 via a wireless transmission path, such as Bluetooth transmission, but the present invention is not limited thereto. Specifically, when the frequency of the first voltage signal exceeds a threshold, the processing module generates a notification signal for transmission to the application device 2 via the wireless transmission path. Accordingly, when the application device 2 is an alarm device, the corresponding voltage signal can be generated according to a special pressure mode set by the power generation module 10 and interpreted to determine if there is an emergency. For example, when the processing module 40 calculates the frequency of the first voltage signal V1, if the processing module 40 determines that the frequency of the first voltage signal V1 exceeds a threshold within the set time, i.e. the processing module 40 can determine the number of peaks of the first voltage signal V1, such as the set time and the set number is 5 peaks in one second. That is, after manually stepping on the bicycle pedal 61 or the power generating module 10 of the shoes 62, 63 with one foot for five times in one second, the processing module 40 generates a notification signal. Then, the notification signal is transmitted to the application device 2 through the wireless transmission module 50 for the application device 2 to issue an emergency signal. However, the intelligent energy harvesting device 1 in the present invention is not limited to the above application.

Furthermore, the application device 2 can also include a radio frequency identification (RFID) system signal receiver or an access control module. Also, the intelligent energy harvesting device 1 can cooperate with the processing module 40 and the wireless transmission module 50 to generate an RFID signal for the RFID system signal receiver to receive it. For example, in the application of the shoes 62, 63, the different shoes 62, 63 worn by two feet can be regarded as a combined ID, and the respective IDs of the shoes 62, 63 send different RFID system signals to the RFID system signal receiver of the application device 2 within a specified time. After being identified by the application device 2, the identity is authenticated. For example, the inductive safety lighting, unlike traditional lighting that detects and illuminates when anyone passes by, can cooperate with the intelligent energy harvesting device 1 in the present invention and the RFID system for security lighting only when a specific identified signal packet is received and the signal packet is processed by the application device 2.

In addition, the RFID system signal can further enable the application device 2 to perform access control, such as a specific frequency signal by using the shoes 62, 63 to step on within a specified range. For example, in the case that the shoe 62 does not move and the shoe 63 steps on two times in a second, since the shoes 62, 63 of the two feet independently transmit different RFID system signals, different signal combinations can be distinguished by this. Actively sending a signal to the application device 2 can achieve the effect of starting a safety light or switching the door. Furthermore, the signal receiver can be locally arranged in conjunction with the regionality. When the shoes 62, 63 are used to step on each time, an RFID system signal can be sent. It can identify the identity and cooperate with the receiver of the application device 2 for regional positioning and tracking. Accordingly, the power generation module 10 of the present invention can cooperate with the designed energy management module 30, such that the intelligent energy harvesting device 1 can realize autonomous energy management without additional power supply, achieve the functions of actively transmitting and receiving signals, and cooperate with the application device 2 to achieve a wider range of applications.

It should be noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. An intelligent energy harvesting device, used to transfer a signal to an application device, the intelligent energy harvesting device comprising:

a power generation module, used to generate a first voltage signal;

a battery, used to generate a second voltage signal; and an energy management module, electrically connected to the power generation module and the battery, for enabling the first voltage signal output from the power generation module to be used as a power signal to provide to the application device, or enabling the first voltage signal output from the power generation module and the second voltage signal output from the battery to collectively serve as the power signal to provide to the application device;

wherein the energy management module comprising:

a first diode, electrically connected between the power generation module and the battery;

a second diode, electrically connected to the power generation module;

a third diode, connected to the power generation module and a ground;

a first switch, wherein a first base, a first collector and a first emitter thereof are electrically connected to the second diode, the battery, and the ground, respectively;

a second switch, wherein a second base and a second collector are electrically connected to the power generation module, and a second emitter thereof is electrically connected to the application device;

a third switch, wherein a third base, a third collector, and a third emitter thereof are electrically connected to the battery, the power generation module and the ground, respectively;

wherein the second base, the second collector, the third collector and the second diode are connected to a first common point;

a fourth switch, wherein a fourth base and a fourth emitter are electrically connected to the battery and the ground, respectively; wherein the first collector, the third base and the fourth base are connected to a second common point; and a fifth switch, wherein a fifth base, a fifth collector and a fifth emitter thereof are electrically connected to a fourth collector of the fourth switch, the application device and the battery, respectively.

2. The intelligent energy harvesting device as claimed in claim 1, wherein the energy management module further enables the power generation module to charge the battery.

3. The intelligent energy harvesting device as claimed in claim 1, wherein the power generation module comprising:

a shell; and a plurality of curved metal structures, disposed in the shell; and a plurality of curved piezoelectric elements, attached to the plurality of curved metal structures; wherein when the shell is compressed, the plurality of curved metal structures are simultaneously deformed to cause the plurality of curved piezoelectric elements to generate the first voltage signal.

4. The intelligent energy harvesting device as claimed in claim 1, wherein when the first voltage signal output from the power generation module is greater than a first specific value, the first voltage signal transmits a voltage exceeding the first specific value to the battery via the first diode.

5. The intelligent energy harvesting device as claimed in claim 1, wherein when the first voltage signal output from the power generation module is greater than a second specific value, the first voltage signal controls the first switch via the second diode, grounds the second voltage signal of the battery, and controls the second switch to be turned on, such that the power generation module outputs the first voltage signal to the application device via the second switch.

6. The intelligent energy harvesting device as claimed in claim 5, wherein when the first voltage signal output from the power generation module is lower than the second specific value, the second voltage signal output from the battery power controls the third switch and the fourth switch to be turned on, and the fifth switch is turned on, such that the power generation module outputs the first voltage signal via the second switch and the battery power outputs the second voltage signal via the fifth switch to co-transfer to the application device.

7. The intelligent energy harvesting device as claimed in claim 1, wherein the energy management module further comprising a boost circuit, for fixedly outputting 5V power signal to the application device.

8. The intelligent energy harvesting device as claimed in 1, the intelligent energy harvesting device further comprising:

a processing module, for calculating a frequency at which a first voltage signal is generated; and a wireless transmission module, used to connect to the application device via a wireless transmission path, wherein when a frequency generated by the first voltage signal is greater than a threshold, the processing module generates a notification signal for transmission to the application device via the wireless transmission path.

9. An energy management module, used in an intelligent energy harvesting device and electrically connected to a power generation module and a battery to transfer a signal to an application device, wherein the power generation module is used to generate a first voltage signal, and the battery is used to generate a second voltage signal; the energy management module comprising:

a first diode, electrically connected between the power generation module and the battery;

a second diode, electrically connected to the power generation module;

a third diode, connected to the power generation module and a ground;

a first switch, wherein a first base, a first collector, and a first emitter thereof are electrically connected to the second diode, the battery, and the ground, respectively;

a second switch, wherein a second base and a second collector thereof are electrically connected to the power generation module, respectively, and a second emitter thereof is electrically connected to the application device;

a third switch, wherein a third base, a third collector and a third emitter are electrically connected to the battery, the power generation module, and the ground, respectively; wherein the second base, the second collector, the third collector, and the second diode are connected to a first common point;

a fourth switch, wherein a fourth base and a fourth emitter thereof are electrically connected to the battery and the ground, respectively; wherein the first collector, the third base, and the fourth base are connected to a second common point; and a fifth switch, wherein a fifth base, a fifth collector, and a fifth emitter thereof are electrically connected to a fourth collector of the fourth switch, the application device, and the battery, respectively; thereby enabling the first voltage signal output from the power generation module to be used as a power signal to provide to the application device, or enabling the first voltage signal output from the power generation module and the second voltage signal output from the battery to collectively serve as the power signal to provide to the application device.

10. The energy management module as claimed in claim 9, wherein when the first voltage signal output from the power generation module is greater than a first specific value, the first voltage signal transmits a voltage exceeding the first specific value to the battery via the first diode.

11. The energy management module as claimed in claim 9, wherein when the first voltage signal output from the power generation module is greater than a second specific value, the first voltage signal controls the first switch via the second diode, grounds the second voltage signal of the battery, and controls the second switch to be turned on, such that the power generation module outputs the first voltage signal to the application device via the second switch.

12. The energy management module as claimed in claim 11, wherein when the first voltage signal output from the power generation module is lower than the second specific value, the second voltage signal output from the battery power controls the third switch and the fourth switch to be turned on, and the fifth switch is turned on, such that the power generation module outputs the first voltage signal via the second switch and the battery power outputs the second voltage signal via the fifth switch to co-transfer to the application device.

13. The energy management module as claimed in claim 9, further comprising a boost circuit, for fixedly outputting 5V power signal to the application device.

14. A voltage signal application system, comprising:

an application device; and an intelligent energy harvesting device, for supplying a power signal to the application device, the intelligent energy harvesting device comprising:

a power generation module, used to generate a first voltage signal;

a battery, used to generate a second voltage signal; and an energy management module, electrically connected to the power generation module and the battery, for enabling the first voltage signal output from the power generation module to be used as a power signal to provide to the application device, or enabling the first voltage signal output from the power generation module and the second voltage signal output from the battery to collectively serve as the power signal to provide to the application device;

a processing module, for calculating a frequency at which a first voltage signal is generated; and a wireless transmission module, configured to connect to the application device via a wireless transmission path, wherein when the frequency of the first voltage signal exceeds a threshold, the processing module generates a notification signal for transmission to the application device via the wireless transmission path; wherein the application device is an alarm or a radio frequency identification (RFID) signal receiver; the alarm is used to generate an alarm signal based on the notification signal received; the RFID signal receiver is used to receive different RFID signals as a combined identification, the different RFID signals are obtained by the wireless transmission module according to different voltage signals generated by the power generation module.

15. The voltage signal application system as claimed in claim 14, wherein the power generation module comprising:

a shell; and a plurality of curved metal structures, disposed in the shell; and a plurality of curved piezoelectric elements, attached to the plurality of curved metal structures; wherein when the shell is compressed, the plurality of curved metal structures are deformed simultaneously to cause the plurality of curved piezoelectric elements generate the first voltage signal.

16. The voltage signal application system as claimed in claim 14, wherein the application device further comprises an access control module for performing access control according to the notification signal sent by the wireless transmission module.

* * * * *